(12) United States Patent
Mou et al.

(10) Patent No.: US 11,162,487 B2
(45) Date of Patent: Nov. 2, 2021

(54) AIR CIRCULATION CONTROL DEVICE

(71) Applicant: Microjet Technology Co., Ltd., Hsinchu (TW)

(72) Inventors: Hao-Jan Mou, Hsinchu (TW);
Shih-Chang Chen, Hsinchu (TW);
Jia-Yu Liao, Hsinchu (TW);
Hung-Hsin Liao, Hsinchu (TW);
Chi-Feng Huang, Hsinchu (TW);
Wei-Ming Lee, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 255 days.

(21) Appl. No.: 16/048,851

(22) Filed: Jul. 30, 2018

(65) Prior Publication Data

US 2019/0055940 A1    Feb. 21, 2019

(30) Foreign Application Priority Data

Aug. 21, 2017   (TW) ................... 10612826.4

(51) Int. Cl.
| | |
|---|---|
| *H05K 5/00* | (2006.01) |
| *F04B 45/047* | (2006.01) |
| *F04B 53/20* | (2006.01) |
| *H05K 7/20* | (2006.01) |
| *B01D 46/10* | (2006.01) |
| *F04B 39/12* | (2006.01) |
| *F04B 39/16* | (2006.01) |

(52) U.S. Cl.
CPC ............ *F04B 45/047* (2013.01); *B01D 46/10* (2013.01); *F04B 39/121* (2013.01); *F04B 39/123* (2013.01); *F04B 39/16* (2013.01); *F04B 53/20* (2013.01); *H05K 7/20136* (2013.01); *H05K 7/20145* (2013.01); *H05K 7/20172* (2013.01)

(58) Field of Classification Search
CPC ...... F04B 53/20; F04B 39/121; F04B 39/123; F04B 39/16; F04B 45/047; B01D 46/10; H05K 7/20136; H05K 7/20145; H05K 7/10172
USPC ......................................................... 454/184
See application file for complete search history.

(56) References Cited

U.S. PATENT DOCUMENTS

| | | | |
|---|---|---|---|
| 2009/0232683 A1 | 9/2009 | Hirata et al. | |
| 2011/0188247 A1* | 8/2011 | Huang ............. | H05K 5/03 362/249.02 |

(Continued)

FOREIGN PATENT DOCUMENTS

| | | |
|---|---|---|
| CN | 1286893 A | 3/2001 |
| CN | 1376266 A | 10/2002 |

(Continued)

*Primary Examiner* — Helena Kosanovic
(74) *Attorney, Agent, or Firm* — Birch, Stewart, Kolasch & Birch, LLP

(57) ABSTRACT

An air circulation control device includes a casing and at least one air pump. The casing includes at least one entrance opening, at least one exit opening and an accommodation space. Each air pump is disposed in and closes the corresponding entrance opening. Each air pump includes a first protective film that is a waterproof and dustproof film structure allowing gas to pass therethrough. When the air pump is enabled, the gas is introduced into the accommodation space through the entrance opening and discharged from the accommodation space through the exit opening, so that the gas is circulated.

8 Claims, 7 Drawing Sheets

(56) References Cited

U.S. PATENT DOCUMENTS

| | | | | |
|---|---|---|---|---|
| 2016/0076530 A1* | 3/2016 | Chen | ............... | F04B 43/046 |
| | | | | 417/413.2 |
| 2016/0271305 A1* | 9/2016 | Kurihara | ............... | A61M 1/009 |
| 2017/0290206 A1* | 10/2017 | Juan | ............... | H05K 7/20972 |

FOREIGN PATENT DOCUMENTS

| | | | |
|---|---|---|---|
| CN | 201600350 | U | 10/2010 |
| CN | 102597520 | A | 7/2012 |
| CN | 205507651 | U | 8/2016 |
| CN | 106524192 | A | 3/2017 |
| CN | 107023459 | A | 8/2017 |
| EP | 2484906 | A1 | 8/2012 |
| EP | 2833706 | A1 | 2/2015 |
| JP | 2001-115969 | A | 4/2001 |
| JP | 2007-187026 | A | 7/2007 |
| JP | 2017-57975 | A | 3/2017 |

* cited by examiner

AIR CIRCULATION CONTROL DEVICE

FIELD OF THE INVENTION

The present disclosure relates to an air circulation control device, and more particularly to a miniature, silent, waterproof and dustproof air circulation control device.

BACKGROUND OF THE INVENTION

With the advancement of science and technology, gas transportation devices used in many sectors such as pharmaceutical industries, computer techniques, printing industries or energy industries are developed toward elaboration and miniaturization. The gas transportation devices are important components that are used in for example micro pumps, micro atomizers, printheads or industrial printers. Therefore, it is important to provide an improved structure of the gas transportation device.

For example, in various electronic devices or medical devices, pneumatic devices or pneumatic machines use motors or gas valves to transfer gases. However, due to the volume limitations of the motors and the gas valves, the pneumatic devices or the pneumatic machines are bulky in volume. In other words, the conventional pneumatic device fails to meet the miniaturization requirement and is not portable. Moreover, during operations of the motor or the gas valve, annoying noise is readily generated. That is, the conventional pneumatic device is neither friendly nor comfortable to the user.

However, since the conventional motor and the conventional gas valve are not waterproof, some problems occur. If moisture or liquid is introduced into the motor or the gas valve during the process of transferring the gas, the outputted gas contains moisture. In case that the gas containing moisture is used to remove heat from the electronic components or the precision instruments, the electronic components or the precision instruments are possibly damped, rusted or even damaged. Similarly, the components within the conventional motor and the conventional gas valve are possibly damped, rusted or damaged. Moreover, the conventional motor and the conventional gas valve are not waterproof. If dust is introduced into the motor or the gas valve during the process of transferring the gas, the components are possibly damaged and the gas transportation efficiency is reduced.

Therefore, there is a need of providing an air circulation control device with small, miniature, silent, portable and comfortable benefits in order to eliminate the above drawbacks.

SUMMARY OF THE INVENTION

An object of the present disclosure provides an air circulation control device suitably applied to various portable or wearable equipments or machines, generating air fluctuation by high frequency operation of a piezoelectric actuator, so that a pressure gradient is generated in designed fluid channel to facilitate high speed gas flow. Also, since there is an impedance difference between a feeding direction and an exiting direction of the fluid channel, the gas can be transferred from an inlet side to an outlet side. Consequently, the problem that the equipments or machines using the conventional gas transportation device are bulky in volume, difficult to have a compact size and be portable, as well as the noise problem, are solved.

Another object of the present disclosure provides an air circulation control device with the waterproof and dustproof efficacy. The air circulation control device is equipped with at least one protective film to filter out the moisture and the dust contained in the introduced gas. Since the moisture and the dust are not introduced into the inner portion of the air circulation control device, the components are not damaged by the moisture and the dust and the gas transportation efficiency is enhanced.

In accordance with an aspect of the present disclosure, an air circulation control device is provided. The air circulation control device includes a casing and at least one air pump. The casing includes at least one entrance opening, at least one exit opening and an accommodation space. The at least one air pump is disposed in and closes the at least one entrance opening. The at least one air pump includes a first protective film. The first protective film is a waterproof and dustproof film structure allowing gas to pass therethrough. When the at least one air pump is enabled, the gas is introduced into the accommodation space through the at least one entrance opening and discharged from the accommodation space through the at least one exit opening, so that the gas is circulated.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
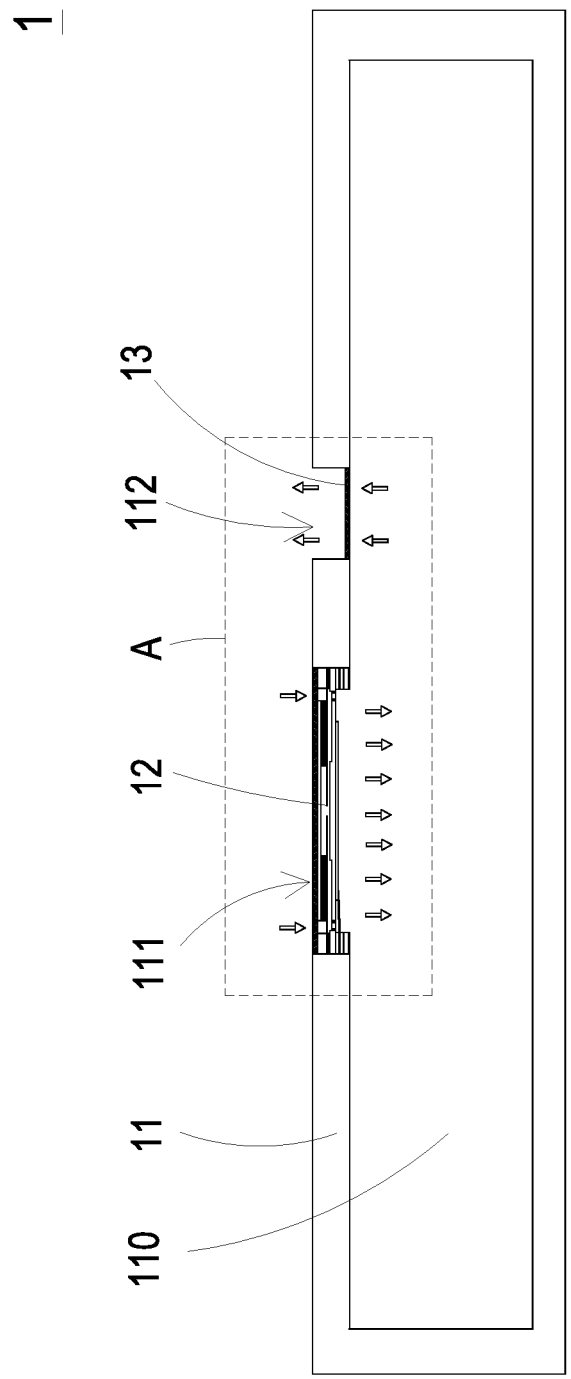
FIG. 1 is a schematic cross-sectional view illustrating an air circulation control device according to an embodiment of the present disclosure.
Figure 2:
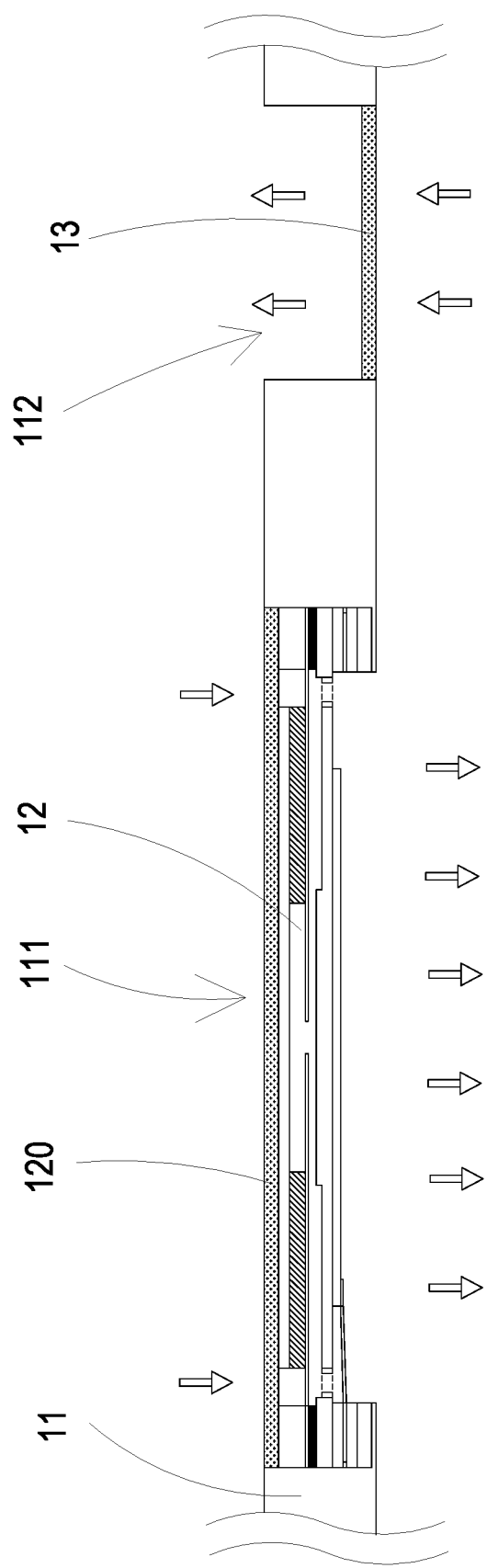
FIG. 2 is a schematic cross-sectional view illustrating the enlarged portion A of the air circulation control device of FIG. 1.

Please refer to FIGS. 1 to 2. FIG. 1 is a schematic cross-sectional view illustrating an air circulation control device according to an embodiment of the present disclosure. FIG. 2 is a schematic cross-sectional view illustrating the enlarged portion A of the air circulation control device of FIG. 1. The present discourse provides an air circulation control device 1 including at least one casing 11, at least one entrance opening 111, at least one exit opening 112, at least one accommodation space 110, at least one air pump 12 and at least one first protective film 120. The number of the casing 11, the entrance opening 111, the exit opening 112, the accommodation space 110, the air pump 12 and the first protective film 120 is exemplified by one for each in the following embodiments but not limited thereto. It is noted that each of the casing 11, the entrance opening 111, the exit opening 112, the accommodation space 110, the air pump 12 and the first protective film 120 can also be provided in plural numbers.

The present disclosure provides the air circulation control device 1 suitably installed in a miniature and compact space for facilitating gas circulation as well as being waterproof, dustproof and silent. The air circulation control device 1 can be applied to various electronic components and medical equipments. Preferably, the air circulation control device 1 is applied to a portable electronic device. As shown in FIGS. 1 and 2, the air circulation control device 1 includes a casing 11 and an air pump 12. The casing 11 includes an entrance opening 111, an exit opening 112 and an accommodation space 110 for accommodating an electronic component (not shown). The entrance opening 111 is in communication between the accommodation space 110 and the exterior of the casing 11. The exit opening 112 is also in communication between the accommodation space 110 and the exterior of the casing 11. The number of the entrance opening 111 and the number of the exit opening 112 are not restricted and may be varied according to the practical requirements. The casing 11 may serve as a housing of a device, e.g., an electronic device, a portable electronic device or a medical equipment. The air pump 12 is disposed in the entrance opening 111, thereby closing the entrance opening 111. The air pump 12 is used for guiding the gas from the exterior of the casing 11 into the accommodation space 110. In this embodiment, the air circulation control device 1 includes one air pump 12. However, the number of the air pump 12 is not restricted thereby and may vary according to the number of the entrance opening 111 of the casing 11. Moreover, as shown in FIG. 2, the air pump 12 further includes a first protective film 120. The first protective film 120 is a waterproof and dustproof film structure allowing gas to pass therethrough. When the air pump 12 is enabled, the gas is introduced into the accommodation space 110 through the entrance opening 111. Then, due to the change of the gas pressure gradient, the gas in the accommodation space 110 is discharged through the exit opening 112. Consequently, the purpose of circulating the gas is achieved. Meanwhile, the first protective film 120 prevents the moisture and the dust from entering the accommodation space 110, so that the components within the accommodation space 110 are not rusted or damaged by the moisture, or damaged by accumulation of the dust.

In this embodiment, the air circulation control device 1 further comprises at least one second protective film 13. The second protective film 13 is disposed in the exit opening 112 and closes the exit opening 112. The second protective film 13 is a waterproof and dustproof film structure allowing the gas to pass therethrough. The number of the second protective film 13 may be corresponding to the number of the exit opening 112. Since the second protective film 13 is waterproof and dustproof, the moisture and the dust are prevented from entering the accommodation space 110 through the exit opening 112 and the components within the accommodation space 110 are not rusted or damaged by the moisture, or damaged by accumulation of the dust.

In some embodiments, the first protective film 120 and the second protective film 13 comply with the Rating IP64 of International Protection Marking (IEC 60529), i.e., Dust protection level 6 (Complete protection, No ingress of dust) and Water protection level 4 (Protection against Splashing of water: Water splashing against the enclosure from any direction shall have no harmful effect). In some other embodiments, the first protective film 120 and the second protective film 13 comply with the Rating IP68 of International Protection Marking (IEC 60529), i.e., Dust protection level 6 and Water protection level 8 (Continuous immersion in water produces no harmful effects).

Figure 3A:
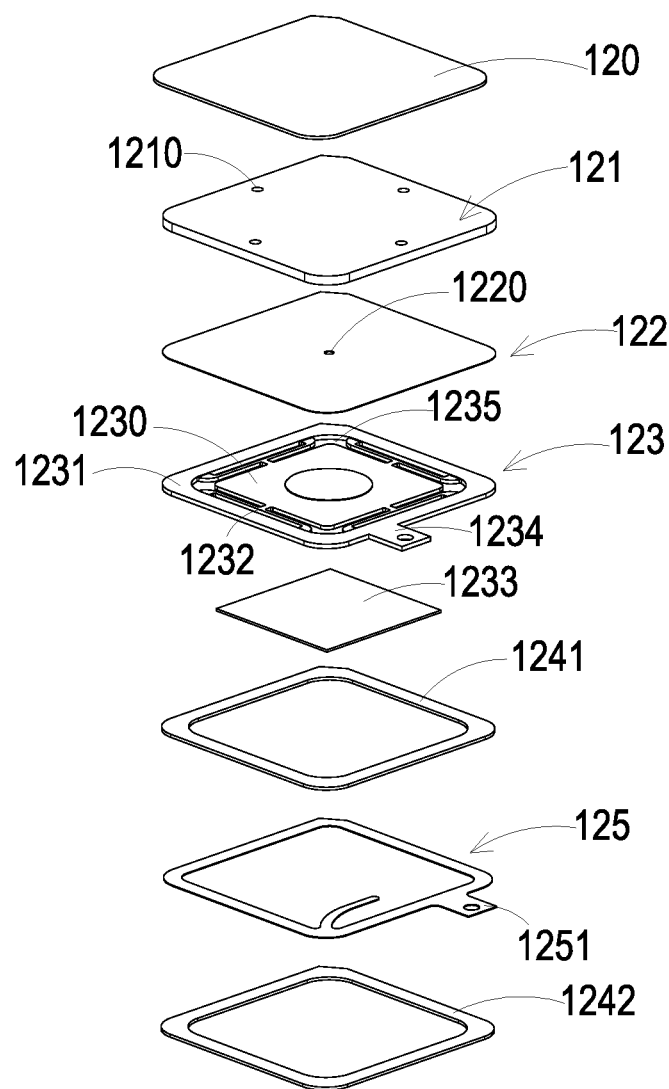
FIG. 3A is a schematic exploded view illustrating the air pump of the air circulation control device according to the embodiment of the present disclosure and taken along a front side.
Figure 3B:
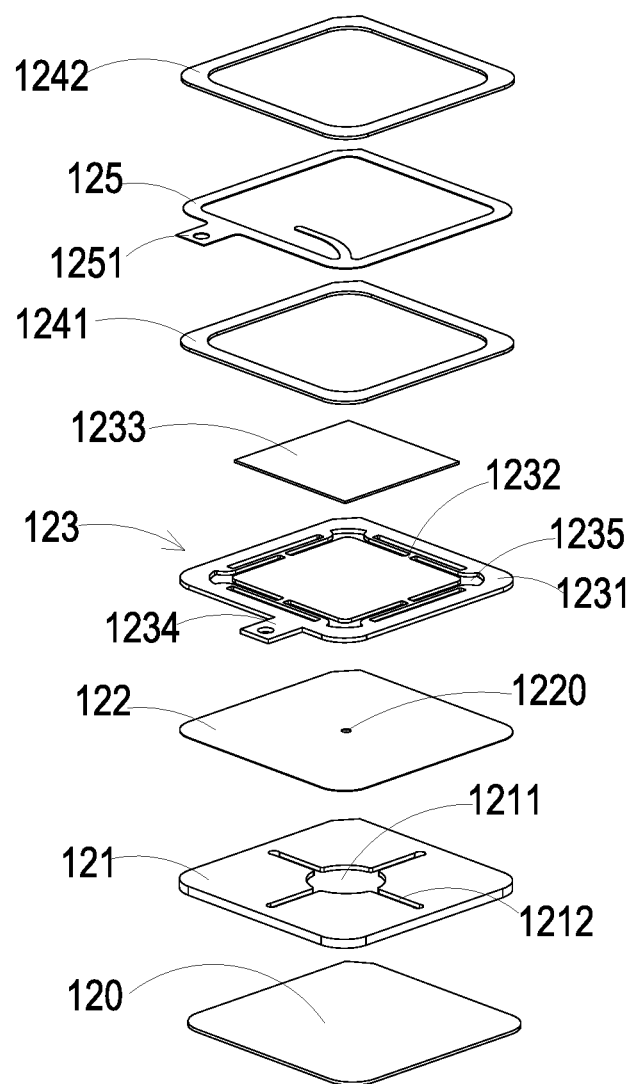
FIG. 3B is a schematic exploded view illustrating the air pump of FIG. 3A and taken along a rear side.

Please refer to FIGS. 3A and 3B. FIG. 3A is a schematic exploded view illustrating the air pump of the air circulation control device according to the embodiment of the present disclosure and taken along a front side. FIG. 3B is a schematic exploded view illustrating the air pump of FIG. 3A and taken along a rear side. In the present embodiment, the air pump 12 includes the first protective film 120, a gas inlet plate 121, a resonance plate 122, a piezoelectric actuator 123, a first insulation plate 1241, a conducting plate 125 and a second insulation plate 1242, which are stacked on each other sequentially to be assembled. The first protective film 120 may be attached on an outer surface of the gas inlet plate 121. The piezoelectric actuator 123 may be disposed spatially corresponding to the resonance plate 122, and may be assembled by a suspension plate 1230 and a piezoelectric ceramic plate 1233. When the piezoelectric actuator 123 is enabled, the gas is fed into the inlet 1210 of the gas inlet plate 121 and transferred to plural pressure chambers (not shown) for being further transferred downwardly.

As shown in FIG. 3A, the gas inlet plate 121 of the air pump 12 has the at least one inlet 1210. In this embodiment, as shown in FIG. 3A, the gas inlet plate 121 has four inlets 1210. It should be noted that the number of the inlet 1210 is not restricted and can be varied according to practical requirement. In response to the action of the atmospheric pressure, the gas can be introduced into the air pump 12 through the inlets 1210.

As shown in FIG. 3B, a central cavity 1211 and four convergence channels 1212 are formed on a bottom surface of the gas inlet plate 121. Each of the convergence channels 1212 is disposed spatially corresponding to one of the inlets 1210 for guiding and converging the gas introduced in the inlets 1210 to the central cavity 1211 to further transfer the gas downwardly. In this embodiment, the at least one inlet 1210, the at least one convergence channel 1212 and the central cavity 1211 of the gas inlet plate 121 are integrally formed from a single structure. A convergence chamber is formed at the central cavity 1211 for temporarily storing the gas. In some embodiments, the gas inlet plate 121 may be made of stainless steel. In other embodiments, the depth of the convergence chamber defined by the central cavity 1211 may be equal to the depth of the at least one convergence channel 1212.

Referring to FIGS. 3A and 3B, the first protective film 120 is attached on the top surface of the gas inlet plate 121 and completely covering the four inlets 1210 of the gas inlet plate 121. The first protective film 120 is a waterproof and dustproof film structure only allowing the gas to pass therethrough. When the air pump 12 is operating to transfer gas, the gas is filtered by the first protective film 120 and the moisture and dust contained in the gas are removed by the first protective film 120. Consequently, the gas without moisture and dust is introduced into the inlets 1210, and the components within the air pump 12 are not damaged or rusted by the moisture or accumulation of the dust. Moreover, the gas transportation efficiency is enhanced. Furthermore, due to the arrangement of the first protective film 120, the air pump 12 is capable of blowing out the gas without moisture and dust. Consequently, the components contacted with the blown gas from the air pump 12 are prevented from being damaged by the moisture or dust. In some embodiments, the air pump 12 comprises plural first protective films 120, each of which has a size matching the size of a single inlet 1210 and is disposed in the corresponding inlet 1210 to cover it for filtering the moisture and dust contained in the introduced gas.

In this embodiment, the resonance plate 122 is made of a flexible material. The resonance plate 122 has a central aperture 1220 formed spatially corresponding to the central cavity 1211 of the bottom surface of the gas inlet plate 121. The central aperture 1220 allows the gas to be transferred therethrough. The resonance plate 122 may be made of copper.

Figure 4A:
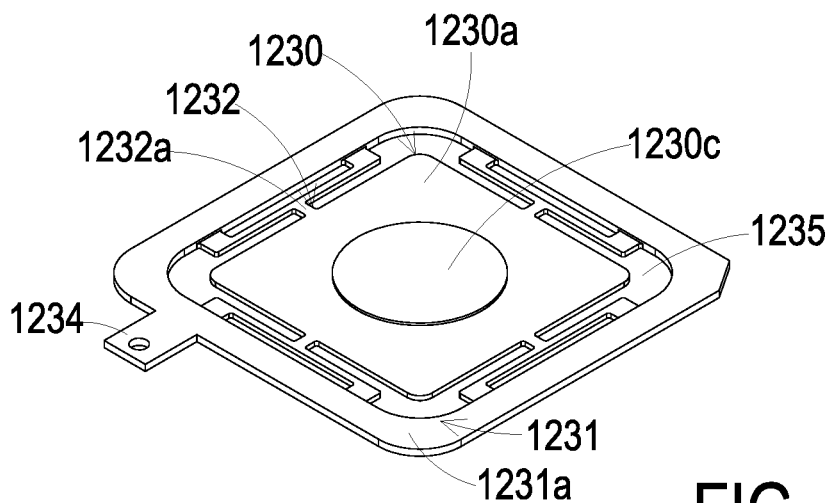
FIG. 4A is a schematic perspective view illustrating the piezoelectric actuator of the air pump of FIG. 3A and taken along the front side.
Figure 4B:
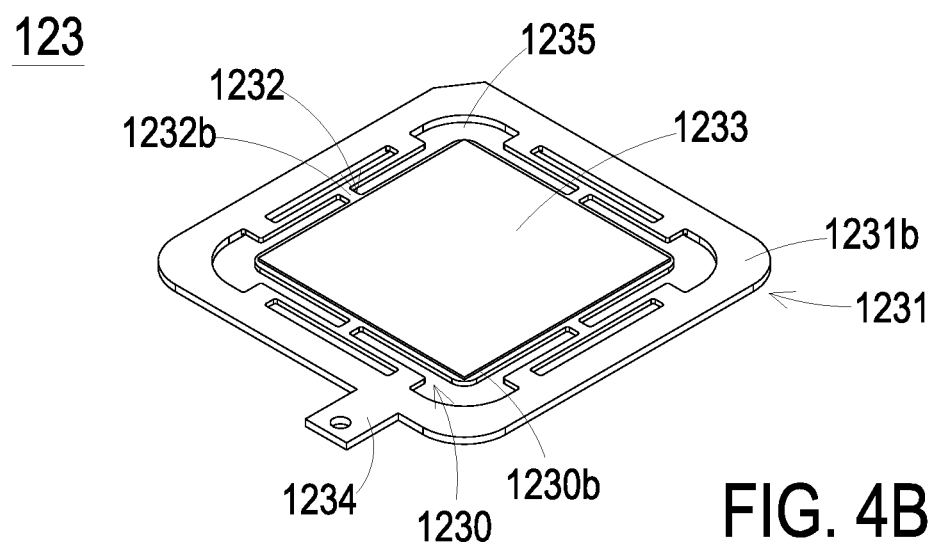
FIG. 4B is a schematic perspective view illustrating the piezoelectric actuator of the air pump of FIG. 3A and taken along the rear side.
Figure 4C:
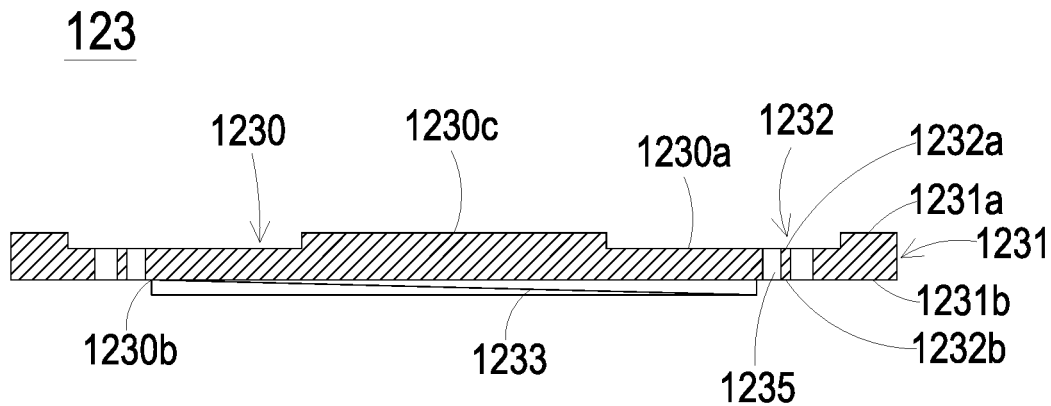
FIG. 4C is a schematic cross-sectional view illustrating the piezoelectric actuator of the air pump of FIG. 3A.

Please refer to FIGS. 4A, 4B and 4C, which schematically illustrate the front, rear and cross-sectional perspective views of the piezoelectric actuator of the air pump of FIG. 3A. In this embodiment, the piezoelectric actuator 123 includes a suspension plate 1230, an outer frame 1231, a plural brackets 1232 and a piezoelectric ceramic plate 1233. The piezoelectric ceramic plate 1233 is attached on a bottom surface 1230b of the suspension plate 1230. Each of the plural brackets 1232 is connected between the suspension plate 1230 and the outer frame 1231, while the two ends of the brackets 1232 are connected with the outer frame 1231 and the suspension plate 1230 respectively. Therefore, the suspension plate 1230 is elastically supported by the brackets 1232. At least one vacant space 1235 is formed between the bracket 1232, the suspension plate 1230 and the outer frame 1231 for allowing the gas to go through. The type of the suspension plate 1230 and the outer frame 1231 and the type and the number of the at least one bracket 1232 may be varied according to the practical requirements. Moreover, a conducting pin 1234 is protruded outwardly from the outer frame 1231 so as to be electrically connected to an external circuit (not shown).

In this embodiment, the suspension plate 1230 has a bulge 1230c that makes the suspension plate 1230 a stepped structure. The bulge 1230c is formed on a top surface of 1230a of the suspension plate 1230. The bulge 1230c may be a circular convex structure. Referring to FIGS. 4A, 4B and 4C, a top surface of the bulge 1230c of the suspension plate 1230 is coplanar with a top surface 1231a of the outer frame 1231, and the top surface 1230a of the suspension plate 1230 is coplanar with a top surface 1232a of the bracket 1232. Moreover, there is a specific depth from the bulge 1230c of the suspension plate 1230 (or the top surface 1231a of the outer frame 1231) to the top surface 1230a of the suspension plate 1230 (or the top surface 1232a of the bracket 1232). As shown in FIGS. 4B and 4C, a bottom surface 1230b of the suspension plate 1230, the bottom surface 1231b of the outer frame 1231 and a bottom surface 1232b of the bracket 1232 are coplanar with each other. The piezoelectric ceramic plate 1233 is attached on the bottom surface 1230b of the suspension plate 1230. In some embodiments, the suspension plate 1230, the brackets 1232 and the outer frame 1231 may be integrally formed from a metal plate (e.g., a stainless steel plate).

Please refer to FIGS. 3A and 3B again. In this embodiment, the first insulation plate 1241, the conducting plate 125 and the second insulation plate 1242 of the air pump 12 are stacked on each other sequentially and located under the piezoelectric actuator 123. The profiles of the first insulation plate 1241, the conducting plate 125 and the second insulation plate 1242 substantially match the profile of the outer frame 1231 of the piezoelectric actuator 123. In some embodiments, the first insulation plate 1241 and the second insulation plate 1242 may be made of an insulating material (e.g. a plastic material) for providing insulating efficacy. In some embodiments, the conducting plate 125 may be made of an electrically conductive material (e.g. a metallic material) for providing electrically conducting efficacy. In this embodiment, the conducting plate 125 may have a conducting pin 1251 disposed thereon so as to be electrically connected with an external circuit (not shown).

Figure 5A:
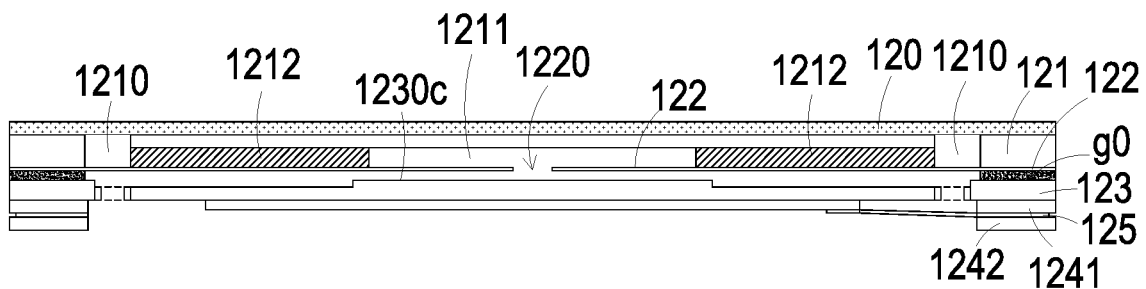
FIGS. 5A to 5E schematically illustrate the actions of the air pump of FIG. 3A.

Please refer to FIGS. 3A and 3B and FIGS. 5A to 5E. FIGS. 5A to 5E schematically illustrate the actions of the air pump of FIG. 3A. As shown in FIG. 5A, the first protective film 120, the gas inlet plate 121, the resonance plate 122, the piezoelectric actuator 123, the first insulation plate 1241, the conducting plate 125 and the second insulation plate 1242 are stacked on each other sequentially. Moreover, there is a gap g0 between the resonance plate 122 and the piezoelectric actuator 123. In this embodiment, the gap g0 between the resonance plate 122 and the outer frame 1231 of the piezoelectric actuator 123 may be filled with a filler (e.g. a conductive adhesive) so that a depth from the resonance plate 122 to the bulge 1230c of the suspension plate 1230 of the piezoelectric actuator 123 can be maintained. The gap g0 ensures the proper distance between the resonance plate 122 and the bulge 1230c of the suspension plate 1230 of the piezoelectric actuator 123, so that the gas can be transferred quickly, the contact interference is reduced and the generated noise is largely reduced. In some embodiments, alternatively, the height of the outer frame 1231 of the piezoelectric actuator 123 is increased, so that the gap is formed between the resonance plate 122 and the piezoelectric actuator 123.

Please refer to FIGS. 5A to 5E again. After the first protective film 120, the gas inlet plate 121, the resonance plate 122 and the piezoelectric actuator 123 are combined together, the at least one inlet 1210 of the gas inlet plate 121 is covered by the first protective film 120. In addition, a convergence chamber for converging the gas is defined by the central aperture 1220 of the resonance plate 122 and the central cavity 1211 of the gas inlet plate 121 collaboratively, and a first chamber 1221 is formed between the resonance plate 122 and the piezoelectric actuator 123 for temporarily storing the gas. Through the central aperture 1220 of the resonance plate 122, the first chamber 1221 is in communication with the central cavity 1211 of the gas inlet plate 121. The peripheral regions of the first chamber 1221 are in communication with the accommodation space 110 of the casing 11 (see FIGS. 1 and 2) through the vacant space 1235 between the brackets 1232 of the piezoelectric actuator 123.

Figure 5B:
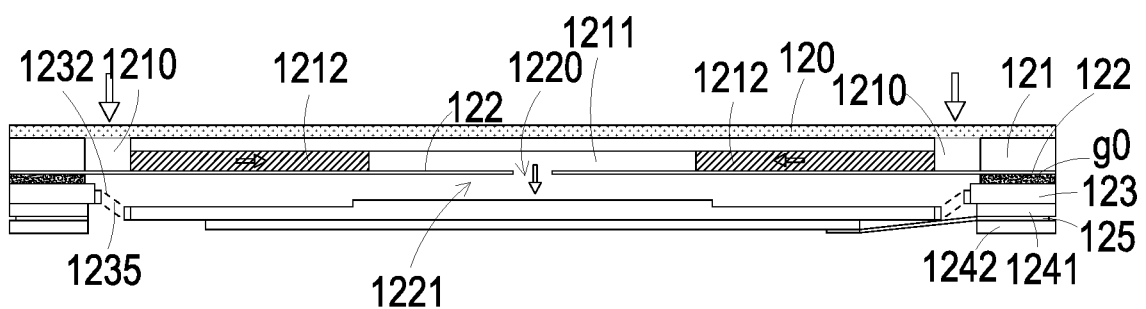

When the air pump 12 of the air circulation control device 1 is enabled, the piezoelectric actuator 123 vibrates along a vertical direction in a reciprocating manner by using the bracket 1232 as a fulcrum. As shown in FIG. 5B, the piezoelectric actuator 123 vibrates downwardly in response to the applied voltage. After the gas is filtered by the first protective film 120 and the moisture and dust contained in the first protective film 120 are removed, the gas is fed into the at least one inlet 1210 of the convergence plate 12. Then, the gas is converged to the central cavity 1211 of the gas inlet plate 121 through the at least one convergence channel 1212, and transferred downwardly to the first chamber 1221 through the central aperture 1220 of the resonance plate 122.

Figure 5C:
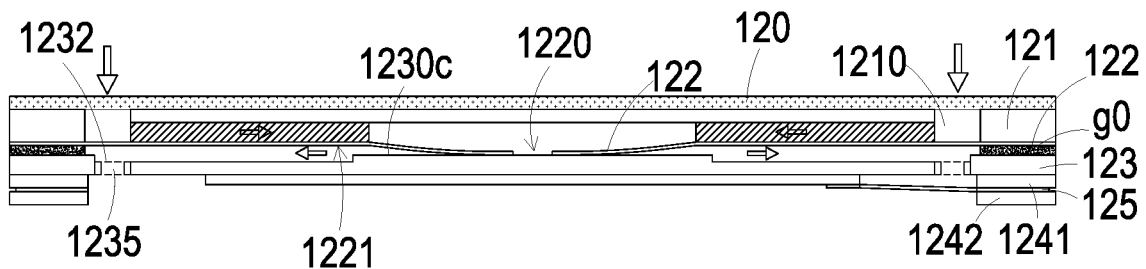
Figure 5D:
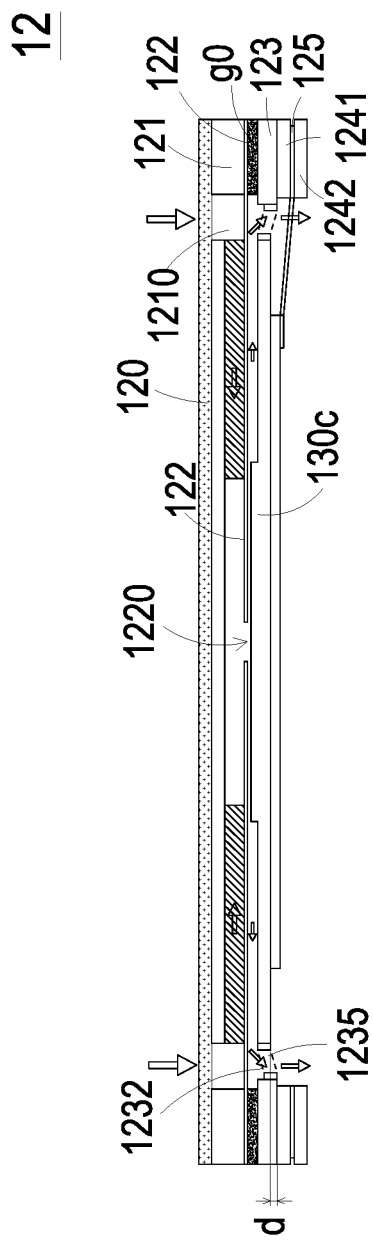
Figure 5E:
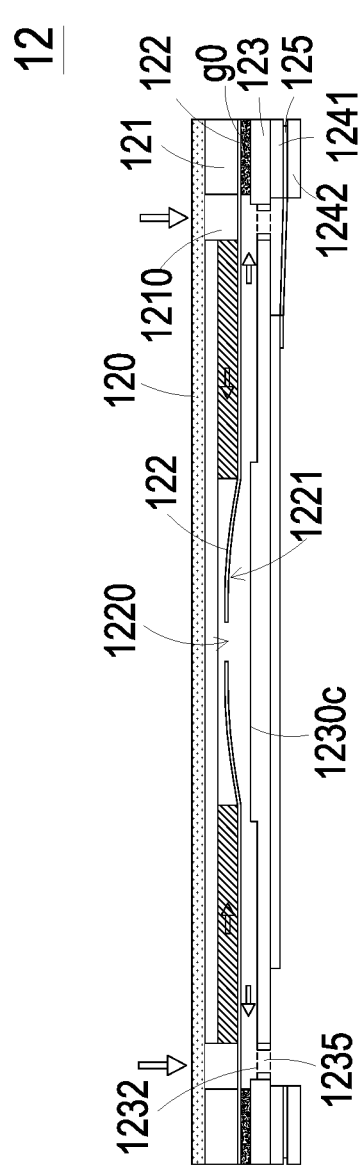

As the piezoelectric actuator 123 is enabled, the resonance of the resonance plate 122 occurs. Consequently, the resonance plate 122 vibrates along the vertical direction in the reciprocating manner. As shown in FIG. 5C, the resonance plate 122 vibrates downwardly, so as to contact and attach on the bulge 1230c of the suspension plate 1230 of the piezoelectric actuator 123. Owing to the deformation of the resonance plate 122 described above, a middle communication space of the first chamber 1221 is closed, and the volume of the first chamber 1221 is compressed. Under this circumstance, the pressure gradient occurs to push the gas in the first chamber 1221 toward peripheral regions of the first chamber 1221, and flowing downwardly through the vacant space 1235 of the piezoelectric actuator 123. As shown in FIG. 5D, the resonance plate 122 returns to its original position when the piezoelectric actuator 123 deforms upwardly during the vibration. Consequently, the volume of the first chamber 1221 is continuously compressed. Since the piezoelectric actuator 123 is ascended for a displacement d, the gas is continuously pushed toward peripheral regions of the first chamber 1221. Meanwhile, the gas is continuously fed into the at least one inlet 1210 of the gas inlet plate 121 through the first protective film 120 and transferred to the central cavity 1211. Then, as shown in FIG. 5E, the resonance plate 122 moves upwardly, which is cause by the resonance of upward motion of the piezoelectric actuator 123. Under this circumstance, the gas in the central cavity 1211 is transferred to the first chamber 1221 through the central aperture 1220 of the resonance plate 122, then the gas is transferred downwardly through the vacant space 1235 of the piezoelectric actuator 123, and finally the gas is exited from the air pump 12. Consequently, a pressure gradient is generated in the fluid channels of the air pump 12 to facilitate the gas to flow at a high speed. Moreover, since there is an impedance difference between the feeding direction and the exiting direction, the gas can be transferred from the inlet side to the outlet side. Even if a gas pressure exists at the outlet side, the air pump 12 still has the capability of pushing the gas to the outlet side while achieving the silent efficacy. In some embodiments, the vibration frequency of the resonance plate 122 along the vertical direction in the reciprocating manner is identical to the vibration frequency of the piezoelectric actuator 123. That is, the resonance plate 122 and the piezoelectric actuator 123 are synchronously vibrated along the upward direction or the downward direction. It is noted that numerous modifications and alterations of the actions of the air pump 12 may be made while retaining the teachings of the invention.

From the above descriptions, the air circulation control device of the present disclosure makes the ambient gas introduced into the inlet of the air pump as the moisture and dust contained in the gas are filtered out by the first protective film. Due to the operation of the piezoelectric actuator, a pressure gradient is generated in the designed fluid channels and the chambers of the air pump, which makes the gas flow at a high speed to be transferred to the accommodation space of the casing. Then, the gas is discharged from the casing through the exit opening. Consequently, the gas is circulated as well as quickly transferred without noise. Besides, due to the arrangement of the first protective film and the second protective film, the gas discharged from the air pump is dry and clean, which makes the accommodation space also dry and clean. Thus, the components within the accommodation space of the casing are not rusted or damaged by the moisture and accumulation of the dust. Meanwhile, the gas transportation efficiency and the performance of the air circulation control device are also enhanced.

Moreover, since the air circulation control device is equipped with the air pump, the overall volume and thickness of the air circulation control device are reduced. Consequently, the air circulation control device can be applied to the miniature device or the portable electronic device (e.g., the medical equipment or any other appropriate equipment). In other words, the air circulation control device of the present disclosure is industrially valuable.

While the disclosure has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air circulation control device, comprising:
   a casing comprising at least one entrance opening, at least one exit opening and an accommodation space; and
   at least one air pump disposed in the at least one entrance opening and closing the at least one entrance opening, the at least one air pump comprising a gas inlet plate, a resonance plate, a piezoelectric actuator and a first protective film, wherein the first protective film, the gas inlet plate, the resonance plate and the piezoelectric actuator are stacked on each other sequentially, the first protective film is a waterproof and dustproof film structure allowing gas to pass therethrough, and the first protected film covers at least one inlet of the gas inlet plate and is integrally formed on the gas inlet plate,
   wherein when the first protective film and the at least one air pump are disposed in the at least one entrance opening, the first protective film seals the at least one entrance opening and is coplanar with an outer surface of the casing, and when the at least one air pump is enabled, the gas is introduced into the accommodation space through the at least one entrance opening and guided out from the accommodation space through the at least one exit opening, so that the gas is circulated.

2. The air circulation control device according to claim 1, wherein the air circulation control device further comprises at least one second protective film disposed in the at least one exit opening and closing the at least one exit opening, wherein the second protective film is a waterproof and dustproof film structure allowing the gas to pass through.

3. The air circulation control device according to claim 2, wherein the first protective film and the second protective film comply with Rating IP64 of International Protection Marking.

4. The air circulation control device according to claim 2, wherein the first protective film and the second protective film comply with Rating IP68 of International Protection Marking.

5. The air circulation control device according to claim 1, wherein a gap is formed between the resonance plate and the piezoelectric actuator to define a first chamber, wherein when the piezoelectric actuator is enabled, the gas is fed into at least one inlet of the gas inlet plate ana gap is formed between the resonance plate and the piezoelectric actuator to define a first chamber, wherein when the piezoelectric actuator is enabled, the gas is fed into at least one inlet of the gas inlet plate and transferred to the first chamber through the resonance plate, so that the gas is introduced into the at least one entrance opening.

6. The air circulation control device according to claim 1, wherein the gas inlet plate further comprises, at least one convergence channel and a central cavity, wherein the at least one convergence channel is spatially corresponding to the at least one inlet, and the gas fed into the at least one inlet is guided to the central cavity, wherein the resonance plate has a central aperture spatially corresponding to the central cavity of the gas inlet plate, wherein the piezoelectric actuator comprises a suspension plate, an outer frame, at least one bracket and a piezoelectric ceramic plate, wherein the at least one bracket is connected between the suspension plate and the outer frame, and the piezoelectric ceramic plate is attached on a surface of the suspension plate.

7. The air circulation control device according to claim 1, wherein the at least one air pump further comprises at least one insulation plate and a conducting plate, wherein the at least one insulation plate and the conducting plate are sequentially disposed under the piezoelectric actuator.

8. An air circulation control device, comprising:
  at least one casing comprising at least one entrance opening, at least one exit opening and at least one accommodation space; and
  at least one air pump disposed in the at least one entrance opening and closing the at least one entrance opening, the at least one air pump comprising at least one gas inlet plate, at least one resonance plate, at least one piezoelectric actuator and at least one first protective film, wherein the at least one first protective film, the at least one gas inlet plate, the at least one resonance plate and the at least one piezoelectric actuator are stacked on each other sequentially, the at least one first protective film is a waterproof and dustproof film structure allowing gas to pass therethrough, and the at least one first protected film covers at least one inlet of the at least one gas inlet plate and is integrally formed on the at least one gas inlet plate,
 wherein when the at least one first protective film and the at least one air pump are disposed in the at least one entrance opening, the at least one first protective film seals the at least one entrance opening and is coplanar with at least one outer surface of the casing, and when the at least one air pump is enabled, the gas is introduced into the accommodation space through the at least one entrance opening and guided out through the at least one exit opening, so that the gas is circulated.

* * * * *